US010262698B2

(12) United States Patent
Amin-Shahidi et al.

(10) Patent No.: US 10,262,698 B2
(45) Date of Patent: Apr. 16, 2019

(54) INTERMITTENT OPERATION OF COMPARTMENTED PNEUMATICS FOR SEALED DATA STORAGE SYSTEM

(71) Applicant: Western Digital Technologies, Inc., San Jose, CA (US)

(72) Inventors: Darya Amin-Shahidi, San Jose, CA (US); Toshiki Hirano, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/629,641

(22) Filed: Jun. 21, 2017

(65) Prior Publication Data

US 2018/0374509 A1  Dec. 27, 2018

(51) Int. Cl.
G11B 33/14 (2006.01)
G11B 33/12 (2006.01)
G11B 33/02 (2006.01)

(52) U.S. Cl.
CPC ............ G11B 33/125 (2013.01); G11B 33/02 (2013.01); G11B 33/1446 (2013.01)

(58) Field of Classification Search
None
See application file for complete search history.

(56) References Cited

U.S. PATENT DOCUMENTS

| 4,488,192 A | 12/1984 | Treseder |
| 6,560,064 B1 | 5/2003 | Hirano |
| 6,618,246 B2 | 9/2003 | Sullivan et al. |
| 6,831,811 B1 | 12/2004 | Andrikowich et al. |
| 7,218,473 B2 | 5/2007 | Bernett et al. |
| 7,365,937 B2 | 4/2008 | Gunderson |
| 7,398,590 B1 * | 7/2008 | Mann .................... G11B 5/5582 29/603.03 |

(Continued)

FOREIGN PATENT DOCUMENTS

| JP | 62071078 A | * 4/1987 |
| JP | 62279591 A | * 12/1987 |

OTHER PUBLICATIONS

European Patent Office, International Search Report and Written Opinion for corresponding PCT/US2018/021401, dated Jun. 27, 2018.

*Primary Examiner* — William J Klimowicz
(74) *Attorney, Agent, or Firm* — John D. Henkhaus

(57) ABSTRACT

A data storage system includes multiple hermetically-sealed enclosures containing a lighter-than air gas, multiple data storage devices housed in each enclosure and containing the lighter-than-air gas, a tray pneumatic control system each corresponding to and pneumatically coupled to a corresponding hermetically-sealed enclosure, and a rack pneumatic control system pneumatically coupled to each tray pneumatic control system. The tray pneumatic control system may include a tray valve operable in a first way to provide a vacuum in a space between first and second sealing members of the enclosure, and operable in a second way to provide the lighter-than-air gas to the enclosure. The rack pneumatic control system may include a vacuum source operable to provide a vacuum to each tray valve and a lighter-than-air gas source operable to provide the lighter-than-air gas to each tray valve.

20 Claims, 7 Drawing Sheets

(56) References Cited

U.S. PATENT DOCUMENTS

| | | | |
|---|---|---|---|
| 7,538,972 B2 | 5/2009 | Burts-Cooper et al. | |
| 7,570,454 B1 | 8/2009 | Andrikowich et al. | |
| 7,914,858 B1 | 3/2011 | deJesus et al. | |
| 7,986,490 B2 | 7/2011 | Hirono et al. | |
| 8,014,167 B2 | 9/2011 | Gunderson et al. | |
| 8,194,348 B2 | 6/2012 | Jacoby et al. | |
| 8,199,425 B1* | 6/2012 | Gustafson | G11B 33/1486 360/97.12 |
| 8,248,724 B2 | 8/2012 | Hayakawa et al. | |
| 8,451,559 B1 | 5/2013 | Berding et al. | |
| 8,659,849 B2 | 2/2014 | Hayakawa et al. | |
| 8,699,179 B1 | 4/2014 | Golgolab et al. | |
| 8,760,797 B1 | 6/2014 | Beatty et al. | |
| 8,917,477 B1 | 12/2014 | Miyake et al. | |
| 8,934,194 B2 | 1/2015 | Schreck | |
| 9,001,458 B1 | 4/2015 | Vitikkate et al. | |
| 9,612,629 B2* | 4/2017 | Hirano | G06F 1/181 |
| 9,916,872 B1 | 3/2018 | Amin-Shahidi et al. | |
| 2003/0081349 A1* | 5/2003 | Bernett | G11B 25/043 360/97.22 |
| 2003/0089417 A1* | 5/2003 | Bernett | G11B 33/14 141/65 |
| 2003/0090832 A1* | 5/2003 | Bernett | B65B 31/04 360/97.22 |
| 2003/0179489 A1 | 9/2003 | Bernett et al. | |
| 2005/0219740 A1 | 10/2005 | Repphun et al. | |
| 2007/0263319 A1 | 11/2007 | Calderon et al. | |
| 2012/0176701 A1 | 7/2012 | Schreck | |
| 2013/0222947 A1* | 8/2013 | Sugii | G11B 23/505 360/99.08 |
| 2015/0034512 A1 | 2/2015 | Moffat et al. | |
| 2015/0359115 A1 | 12/2015 | Hirano et al. | |
| 2016/0057883 A1 | 2/2016 | Zebian | |
| 2017/0125066 A1 | 5/2017 | Vlassarev et al. | |

\* cited by examiner

INTERMITTENT OPERATION OF COMPARTMENTED PNEUMATICS FOR SEALED DATA STORAGE SYSTEM

FIELD OF EMBODIMENTS

Embodiments of the invention may relate generally to data storage systems and, more particularly, to operation and management of a data storage system such as one filled with a lighter-than-air gas.

BACKGROUND

A hard-disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head that is positioned over a specific location of a disk by an actuator. A read-write head uses a magnetic field to read data from and write data to the surface of a magnetic-recording disk. A write head makes use of the electricity flowing through a coil, which produces a magnetic field. Electrical pulses are sent to the write head, with different patterns of positive and negative currents. The current in the coil of the write head induces a magnetic field across the gap between the head and the magnetic disk, which in turn magnetizes a small area on the recording medium.

HDDs are being manufactured which are hermetically sealed with helium inside. Further, other gases that are lighter than air have been contemplated for use as a replacement for air in sealed HDDs. There are various benefits to sealing and operating an HDD in helium ambient, for example, because the density of helium is one-seventh that of air. Hence, operating an HDD in helium reduces the drag force acting on the spinning disk stack and the mechanical power used by the disk spindle motor. Further, operating in helium reduces the flutter of the disks and the suspension, allowing for disks to be placed closer together and increasing the areal density (a measure of the quantity of information bits that can be stored on a given area of disk surface) by enabling a smaller, narrower data track pitch. The lower shear forces and more efficient thermal conduction of helium also mean the HDD will run cooler and will emit less acoustic noise. The reliability of the HDD is also increased due to low humidity, less sensitivity to altitude and external pressure variations, and the relative absence of corrosive gases or contaminants.

Furthermore, there is a commercial demand for high-capacity digital data storage systems, in which multiple hard disk drives (HDDs) are housed in a common enclosure. Data storage systems often include large enclosures that house multiple shelves on which rows of HDDs are mounted. For example, data storage systems may be suitable for use in data centers, enterprises, and the like.

Any approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY OF EMBODIMENTS

Embodiments of the invention are directed toward a data storage system, and methods for controlling the internal environment within a hermetically-sealed data storage system enclosure and for servicing a data storage system that includes a plurality of hermetically-sealed enclosures. A data storage system comprises a plurality of hermetically-sealed enclosures containing a lighter-than air gas, a plurality of data storage devices housed in each enclosure and containing the lighter-than-air gas, a plurality of tray pneumatic control systems each pneumatically coupled to a corresponding hermetically-sealed enclosure, and a rack pneumatic control system pneumatically coupled to each tray pneumatic control system.

Embodiments include a tray pneumatic control system comprising a tray valve operable in a first way to provide a vacuum in a space between first and second sealing members (i.e., a pressure differential relative to inside the hermetically-sealed enclosure), and operable in a second way to provide the lighter-than-air gas to the corresponding hermetically-sealed enclosure. Embodiments include a rack pneumatic control system comprising a vacuum source operable to provide a vacuum to each tray valve and a lighter-than-air gas source operable to provide the lighter-than-air gas to each tray valve.

Embodiments discussed in the Summary of Embodiments section are not meant to suggest, describe, or teach all the embodiments discussed herein. Thus, embodiments of the invention may contain additional or different features than those discussed in this section. Furthermore, no limitation, element, property, feature, advantage, attribute, or the like expressed in this section, which is not expressly recited in a claim, limits the scope of any claim in any way.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Approaches to a hermetically-sealed and pneumatically-controlled data storage system are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

Physical Description of an Illustrative Operating Context

Embodiments may be used in the context of a hermetically-sealed data storage system, in which multiple hard disk drive (HDD) storage devices may be housed. Housed in such an environment, the operation of the HDDs may be affected. Thus, in accordance with an embodiment, a plan view illustrating an HDD 100 is shown in FIG. 1 to illustrate an exemplary operating context.

Figure 1:
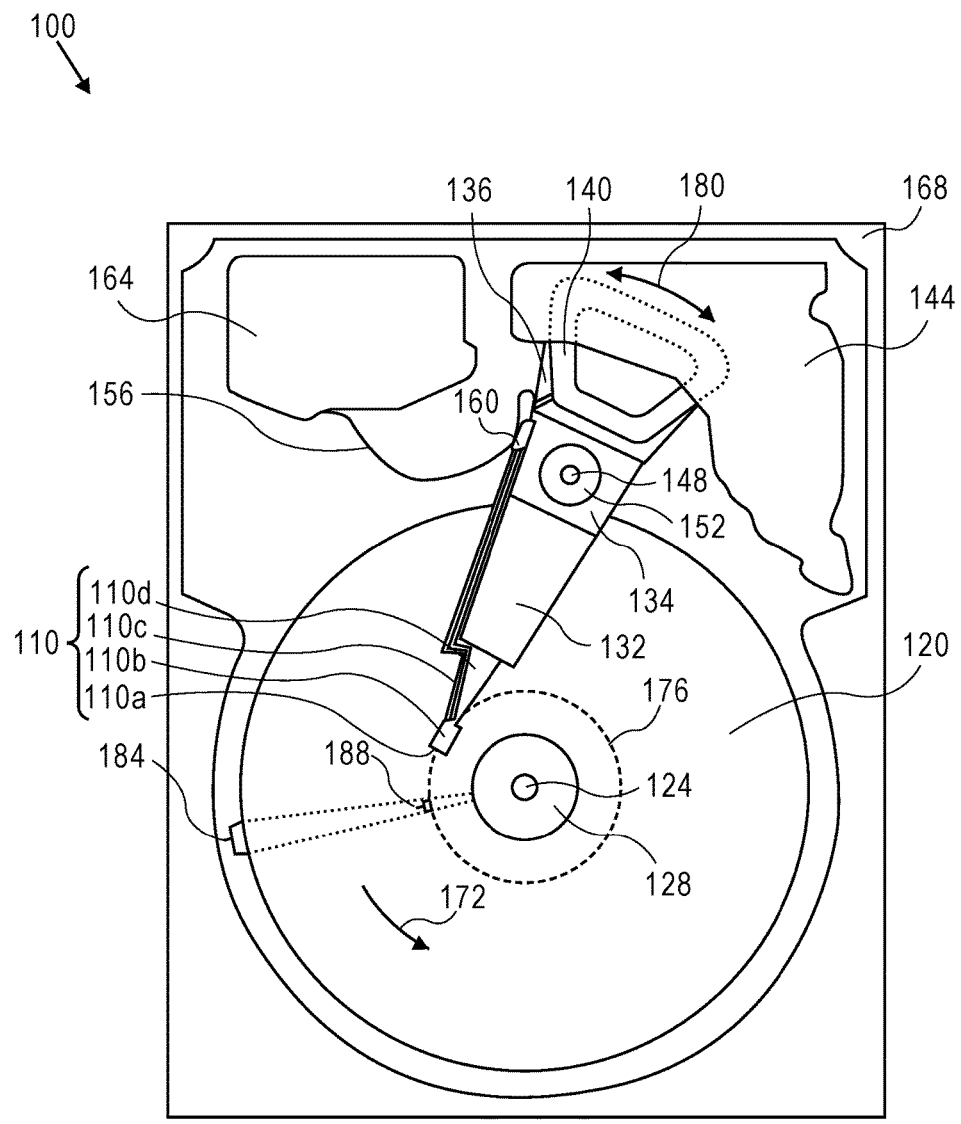
FIG. 1 is a plan view illustrating a hard disk drive (HDD), according to an embodiment.

FIG. 1 illustrates the functional arrangement of components of the HDD 100 including a slider 110*b* that includes a magnetic read-write head 110*a*. Collectively, slider 110*b* and head 110*a* may be referred to as a head slider. The HDD 100 includes at least one head gimbal assembly (HGA) 110 including the head slider, a lead suspension 110*c* attached to the head slider typically via a flexure, and a load beam 110*d* attached to the lead suspension 110*c*. The HDD 100 also includes at least one recording medium 120 rotatably mounted on a spindle 124 and a drive motor (not visible) attached to the spindle 124 for rotating the medium 120. The read-write head 110*a*, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110*a*, are transmitted by a flexible cable assembly (FCA) 156 (or "flex cable"). Interconnection between the flex cable 156 and the head 110*a* may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or simply "base"), in conjunction with an HDD cover, provides a semi-sealed (or hermetically-sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110*a* of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110*b* rides so that the slider 110*b* flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110*b* rides.

The electrical signal provided to the voice coil 140 of the VCM enables the head 110*a* of the HGA 110 to access a track 176 on which information is recorded. Thus, the armature 136 of the VCM swings through an arc 180, which enables the head 110*a* of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110*a* of the HGA 110 reads the servo-burst-signal pattern, which provides a position-error-signal (PES) to the servo electronics, which controls the electrical signal provided to the voice coil 140 of the VCM, thereby enabling the head 110*a* to follow the track 176. Upon finding the track 176 and identifying a particular sectored track portion 188, the head 110*a* either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

Introduction

The term "hermetic" will be understood to describe a sealing arrangement designed to have nominally no (or negligible) gaseous leakage or permeation paths. While terms such as "hermetic", "negligible leakage", "no leakage", etc. may be used herein, note that such a system would often still have a certain amount of permeability and, therefore, not be absolutely leak-free. Hence, the concept of a desired or target "leak rate" may be used herein.

The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees.

As discussed, helium and other gases that are lighter than air have been contemplated for use as a replacement for air in sealed hard disk drives (HDDs), and that there is a commercial demand for digital data storage systems in which multiple HDDs or other data storage devices are housed in a common enclosure. Hence, one "hybrid" approach to high-capacity storage systems may be to provide system-level sealing of helium inside an enclosure in which multiple conventional HDDs are housed, rather than hermetically sealing each HDD individually. Further, elastomeric seals are an attractive candidate for system-level sealing due to their ease of manufacturing and their low cost.

However, a shortcoming with the use of elastomeric seals is their relative ineffectiveness at shielding against air, humidity, and other contaminants, which can pollute the sealed internal environment of a sealed data storage system and adversely affect operation of the HDDs housed therein. One approach attempting to overcome such ineffectiveness could be to employ a helium supply to constantly refresh the sealed volume and dilute the contaminants, but such an approach would require a significantly large-volume helium supply/canister. Additionally, a shortcoming with the use of a system-level seal is that the system may not be readily serviceable in the field due to the need to break (and reseal) the system-level hermetic seal in order to replace a failed HDD, which can be a costly and timely endeavor. Thus, each HDD or other storage device is effectively a "fail-in-place" device, a limitation which could in turn affect the ability of the other HDDs co-housed within a given sealed enclosure to operate continuously if field servicing (e.g., service at the point of location/operation by a user/owner/servicer) is performed.

In any case, lighter-than-air gas filled data storage systems likely rely on a pneumatic control system for seal and gas management. In order to realize desired cost savings, the pneumatics should be relatively low cost while also being reliable, where reliability requirements may drive the pneumatic control system (e.g., tubes, fittings, valves) in the direction of stringent gas leakage requirements. Hence, a compartmented pneumatic control system, which operates only intermittently, may contribute to meeting the cost effectiveness and reliability goals.

Sealed Data Storage System Assembly

Figure 2:
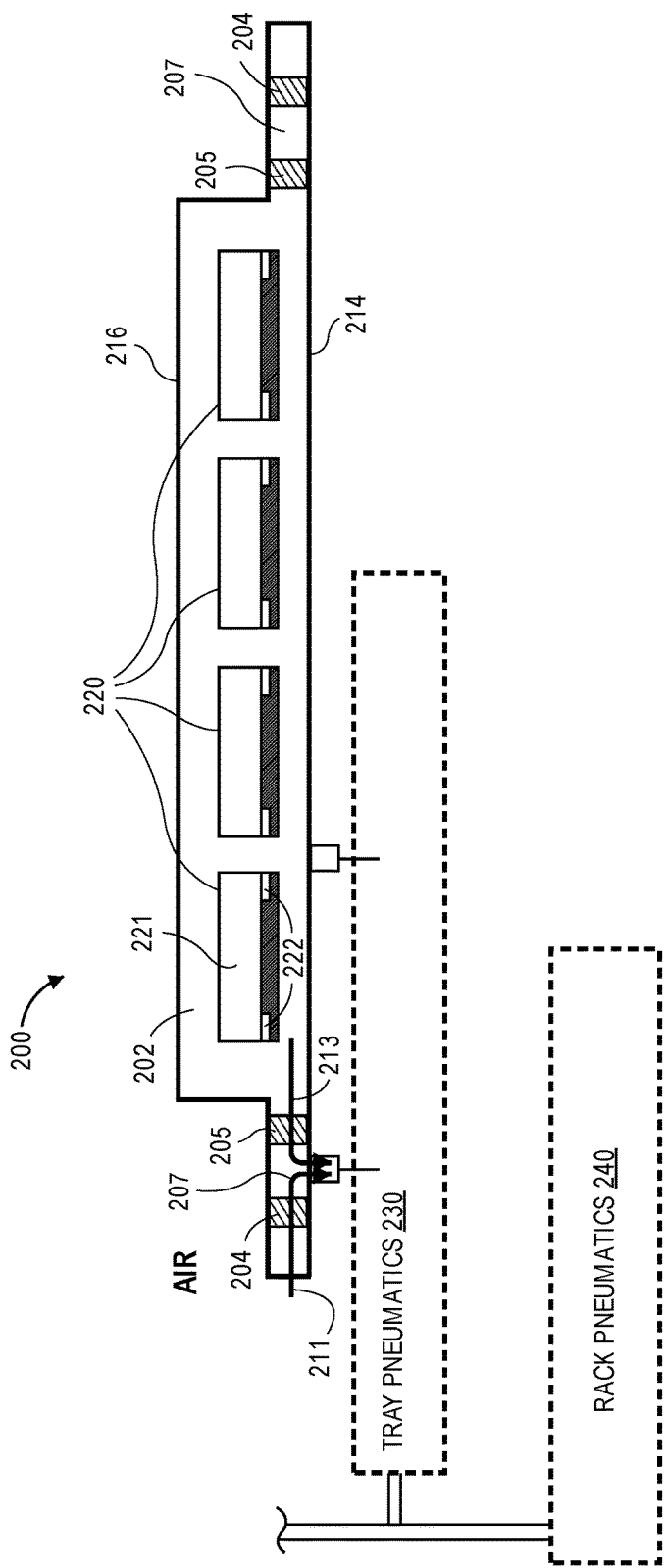
FIG. 2 is a cross-sectional side view diagram illustrating a data storage system assembly (or "tray"), according to an embodiment.

FIG. 2 is a cross-sectional side view diagram illustrating a data storage system assembly (or "tray"), according to an embodiment. Data storage system tray 200 ("tray 200") comprises a hermetically-sealed enclosure 202 coupled with a corresponding tray pneumatic control system 230 ("tray pneumatics 230"), a first sealing member (or simply "seal") 204 positioned at an interface of the enclosure 202 and external environment (e.g., air), and a second sealing member (or simply "seal") 205 spaced from the first sealing member 204, according to an embodiment. Each tray pneumatics 230 is pneumatically coupled to a rack pneumatic control system 240 ("rack pneumatics 240"). According to an embodiment, tray 200 further comprises a lighter-than-air gas enclosed within the hermetically-sealed enclosure 202. For non-limiting examples, a substantially helium or substantially nitrogen gas may be injected into and maintained within the enclosure 202.

The nature and composition of the sealing members 204, 205 may vary from implementation to implementation. For non-limiting examples, first sealing member 204 and second sealing member 205 may be elastomeric, adhesive (e.g., epoxy), laminate, and the like. Furthermore, each of the first and second sealing members 204, 205 may be constructed of multiple sealing members, e.g., for redundancy purposes. A vacuum operates in the space 207 between the first seal 204 and the second seal 205, as depicted, thereby generating a lower (fluid, or gaseous) pressure in the space 207 than the (fluid, or gaseous) pressure in the enclosure 202. According to an embodiment, by generating a lower pressure in the space 207 than in the enclosure 202, the vacuum also generates a lower pressure in the space 207 than the atmospheric pressure in the external environment.

In FIG. 2, while the tray 200 is depicted as having two sets of first and second sealing members 204, 205, this is not intended to mean that the tray 200 requires two such double-barrier vacuum seals. Rather, the depiction is intended to reflect an embodiment in which the tray 200 comprises a base 214, at the perimeter of which the first and second sealing members 204, 205 are positioned and the vacuum operates, and a cover 216 coupled with the base 214 (see, e.g., base 314 and cover 316 of FIG. 3A). For a non-limiting example, the base 214 and the cover 216 of the enclosure 202 may be generally rectangular in shape, where the first sealing member 204 and the second sealing member 205 are concentric FIPG (formed-in-place-gasket) seals positioned around the perimeter of the base 214, with a conduit or plenum pneumatic structure interposed therebetween for vacuum purposes (see, e.g., FIG. 3A).

Based on the foregoing configuration of tray 200, air, humidity and other contaminants (depicted as arrow 211)

that might otherwise migrate into the sealed enclosure 202 through the first and second sealing members 204, 205, may be intercepted (and possibly absorbed/adsorbed) by way of the vacuum and corresponding tray and rack pneumatic control systems 230, 240. Hence, because such humidity, contaminants, etc. are largely kept out of the sealed enclosure 202, the need for a bulky large-volume gas replacement canister is not likely needed with such a system because large-scale gas volume replenishment and purification is not likely necessary. Similarly but in the other direction, based on the foregoing configuration of tray 200, lighter-than-air gas (depicted as arrow 213) that might otherwise leak out of the sealed enclosure 202 through the first and second sealing members 204, 205, may be intercepted by the vacuum and corresponding tray and rack pneumatic control systems 230, 240.

Hence, a double-barrier vacuum seal (i.e., the first and second sealing members 204, 205, along with the vacuum) assembly, such as tray 200, can be utilized to house a plurality of data storage devices 220 within the hermetically-sealed enclosure 202.

"Soft-Sealed" Data Storage Devices

According to an embodiment, a plurality of "soft-sealed" data storage devices 220 (e.g., hard disk drives) are housed in the enclosure 202 of tray 200. The data storage devices 220 are considered "soft-sealed" because each device comprises a device enclosure 221 in which a lighter-than-air gas is contained (e.g., the same lighter-than-air gas that is contained within the hermetically-sealed enclosure 202), and a temporary or non-hermetic seal 222 that temporarily maintains the lighter-than-air gas within the device enclosure 221. The sealing capabilities of such a "soft seal" (i.e., seal 222) are functionally beyond the sealing capabilities of an unsealed or conventionally-sealed device (e.g., those that have a breather filter to maintain environmental pressure equilibrium between the inside and outside of the device, and to maintain a relatively clean internal environment within the device, but which typically operate with air inside), but not to the level of the sealing capabilities provided by a hermetically-sealed device (e.g., those in which a nominal leakage rate is maintained over a significant duration of time, such as for ten years, and which typically operate with a lighter-than-air gas sealed inside using, e.g., solder, an epoxy adhesive bond line, a laminated film, etc.). Over a period of time, the lighter-than-air gas sealed within the hermetically-sealed enclosure 202 of tray 200 is intended to equilibrate with the lighter-than-air gas contained within the device enclosure 221.

According to an embodiment, the non-hermetic "soft seal" (i.e., seal 222) of each data storage device 220 temporarily maintains the lighter-than-air gas therein for a limited duration of at least a week, and could maintain the gas therein for up to several months. Hence, the seal 222 is intended to temporarily maintain the lighter-than-air gas within the device enclosure 221 while the cover 216 of the enclosure 202 is removed, such that each operationally-capable device 220 can continue to operate normally while the cover 216 is removed, according to an embodiment. Therefore, the ability of each data storage device 220 to operate in a lighter-than-air gas environment is provided (e.g., by the soft seal 222 in conjunction with the system-level sealing members 204, 205 with vacuum), while the additional cost typically incurred to robustly hermetically seal a device at the device-level is avoided, while eliminating the "fail-in-place" nature of each device 220 and allowing for field servicing of the system tray 200 with a high level of operational "up time" for the other operationally-capable devices 220 housed within the enclosure 202.

The manner in which each data storage device 220 is soft-sealed may vary from implementation to implementation. For non-limiting examples, inexpensive elastomeric seals, adhesive coating, bag sealing, and the like may be utilized for the soft sealing of each device 220. Note that conventional HDDs are commonly soft-sealed for a period of time during manufacturing, such as for the self-servo-write (SSW) process, using stickers (e.g., metallic, or metal foil) over enclosure orifices, for example. Hence, known SSW sealing techniques may be feasible approaches to soft sealing each device 220.

Data Storage System

Figure 3A:
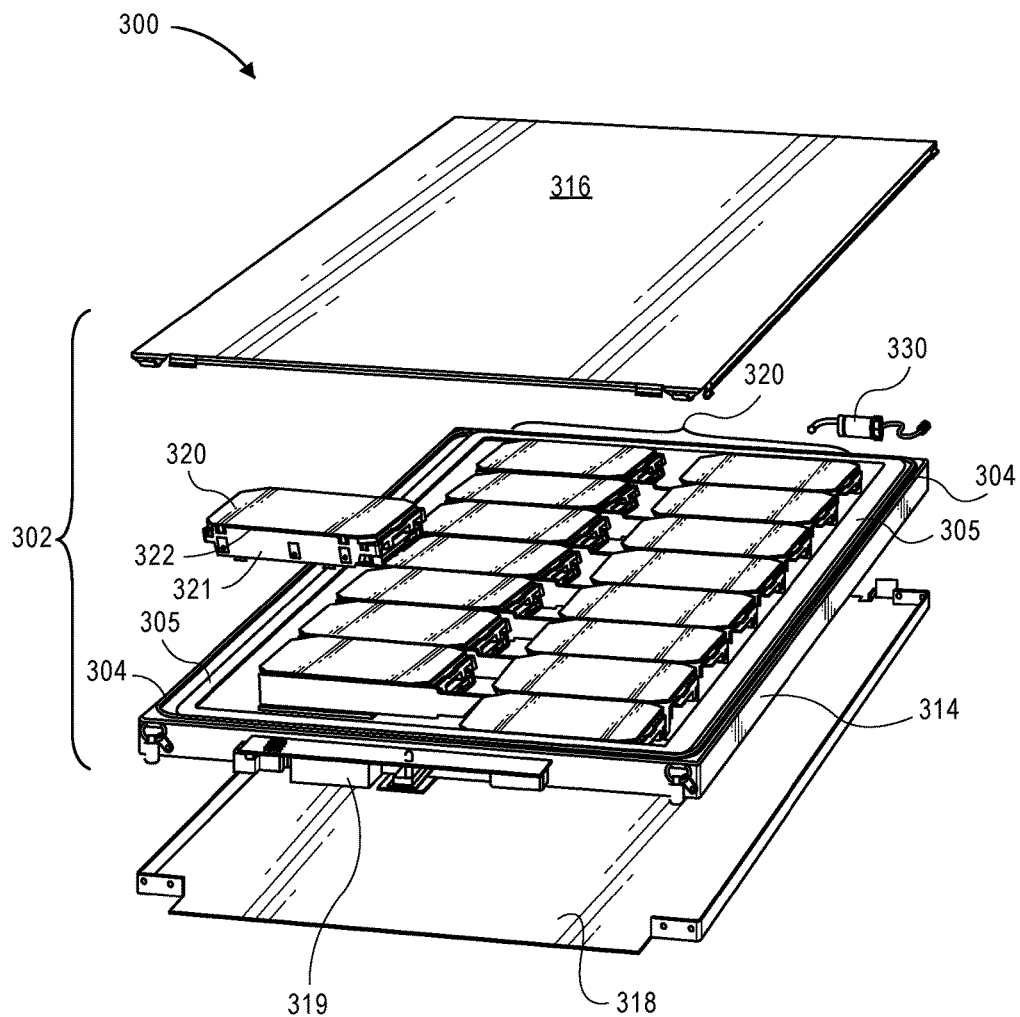
FIG. 3A is an exploded perspective view illustrating a data storage system assembly, according to an embodiment.
Figure 3B:
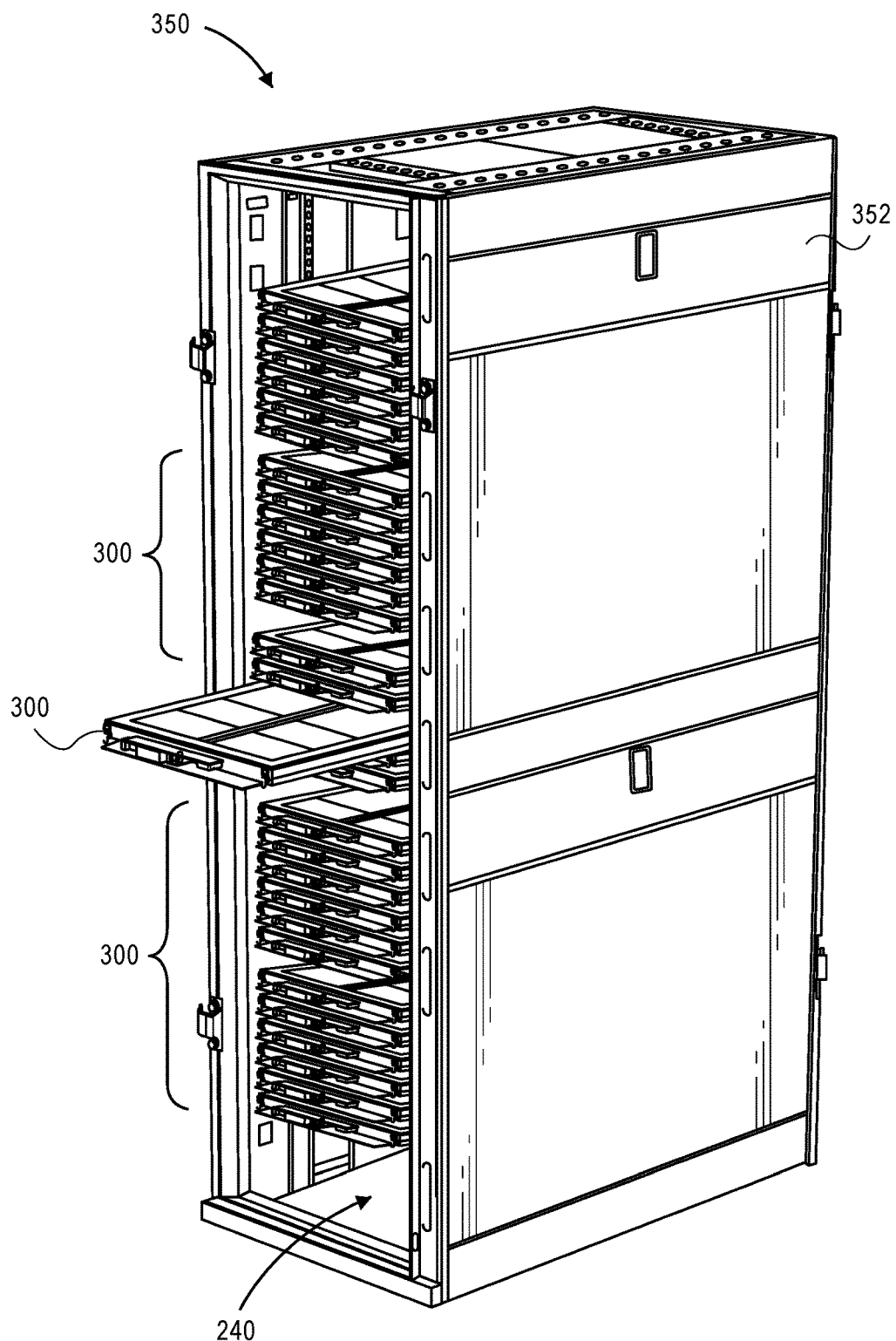
FIG. 3B is a perspective view illustrating a data storage system (or "tray"), according to an embodiment.

FIG. 3A is an exploded perspective view illustrating a data storage system assembly (or "tray"), and FIG. 3B is a perspective view illustrating a data storage system, both according to embodiments. Data storage system assembly 300 ("tray 300") may be an implementation of, or similar to, the tray 200 of FIG. 2. As such, tray 300 comprises a hermetically-sealed enclosure 302 comprising a base 314 and a cover 316, in which a plurality of data storage devices 320 (e.g., HDDs) are housed. According to an embodiment, each device 320 comprises a device enclosure 321 in which a lighter-than-air gas is contained, and a non-hermetic seal 322 that temporarily maintains the lighter-than-air gas within the device enclosure 321. Hence, each device 320 is considered "soft sealed", as described in more detail in reference to device 220 of FIG. 2. According to an embodiment, the tray 300 comprises a chassis 318 providing structural support for the enclosure 302.

According to an embodiment, tray 300 comprises the double-barrier vacuum seal arrangement described elsewhere herein, comprising a first sealing member 304 (e.g., an "air seal") at an interface of the hermetically-sealed enclosure 302 and the external environment, and a second sealing member 305 (e.g., a lighter-than-air gas seal, or "helium seal") spaced from the first sealing member. Further, tray 300 comprises, or is coupled with, a tray pneumatic control system 330 ("tray pneumatics 330") (shown here in simplified form). According to an embodiment, tray pneumatics 330 is the same as or similar to pneumatic control system 230 of FIG. 2, to which reference is made for a corresponding description. Thus, tray 300 may be referred to as a hermetically-sealed tray. Tray 300 may further comprise an I/O (input/output) module 319 for electrical/electronic interface with the one or more shared circuit boards constituent to a data storage system (e.g., data storage system 350 of FIG. 3B).

With reference to FIG. 3B, a data storage system 350 comprises a system enclosure 352 (or "rack 352"), in which multiple hermetically-sealed data storage system trays 300 are housed. Each tray 300 may be placed or slid into a corresponding slot within the rack 352. According to an embodiment, a pneumatic control system such as rack pneumatic control system 240 (FIG. 2) may be configured, or multiplexed, to service multiple trays 300 simultaneously. Rack 352 may further house switches, storage server(s), application server(s), a power supply, cooling fans, etc.

Pneumatic Control Systems for a Data Storage System

According to an embodiment, each tray 200, 300 (FIGS. 2-3B) is pneumatically (and likely mechanically) coupled with a corresponding tray pneumatic control system 230 ("tray pneumatics 230"). Generally, tray pneumatics 230 operates to control and maintain the internal environment of a corresponding hermetically-sealed enclosure 202, 302 (FIGS. 2, 3A) of a tray 200, 300.

Figure 4:
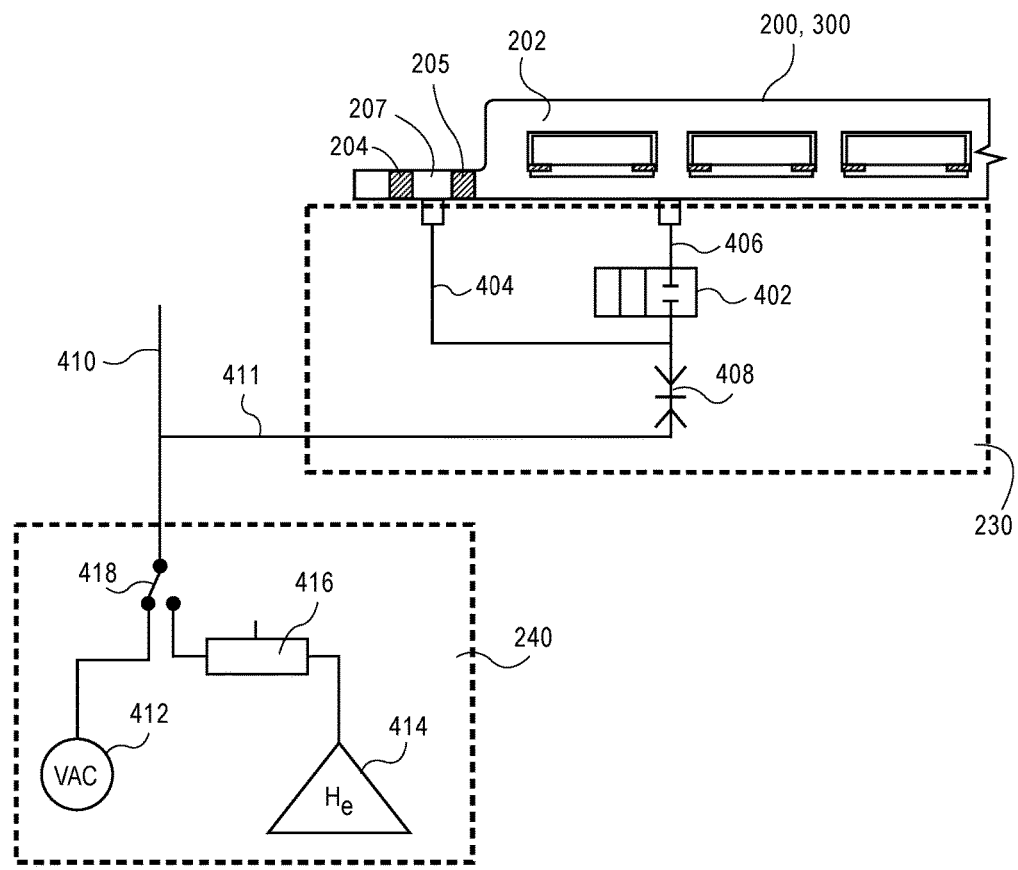
FIG. 4 is a diagram illustrating a pneumatic system for a data storage system, according to an embodiment.

FIG. 4 is a diagram illustrating a pneumatic system for a data storage system, according to an embodiment. According to an embodiment, each individual tray 200, 300, such as housed in an enclosure 352 (FIG. 3B) of a data storage system 350 (FIG. 3B), is pneumatically supported by a corresponding tray pneumatics 230, and a group of tray pneumatics 230 (and, thus, trays 200, 300) is pneumatically supported by a rack pneumatics 240. According to an embodiment, a single rack pneumatics 240 is used to support all the tray pneumatics 230 for every tray 200, 300 housed in the rack 352. Hence, a single supply line 410 can be used to supply, and thus shared by, every tray 200, 300, thereby minimizing the number of pneumatic components that may need to meet more stringent leak requirements.

Figure 5:
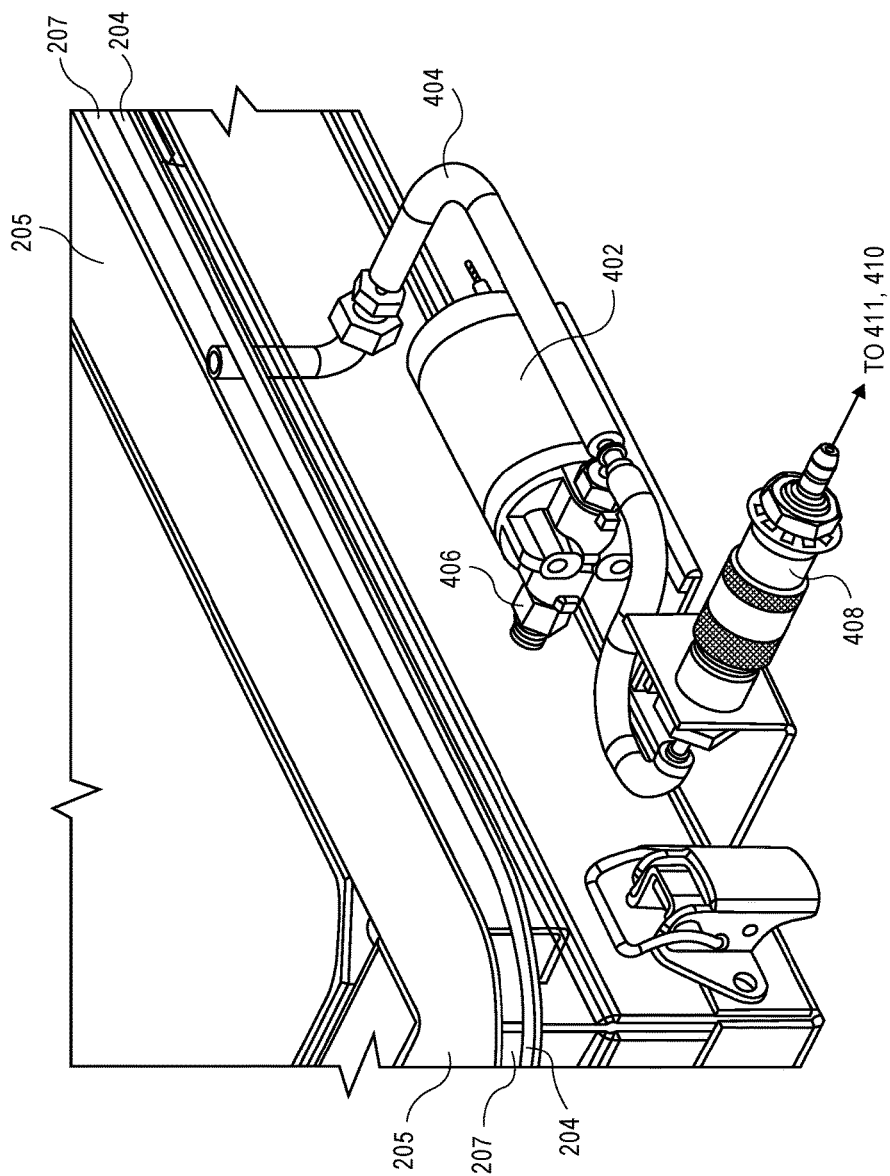
FIG. 5 is a perspective view illustrating a compartmented tray pneumatic system for a data storage system, according to an embodiment.

FIG. 5 is a perspective view illustrating a compartmented tray pneumatic system for a data storage system, according to an embodiment. With reference to FIGS. 4 and 5, according to an embodiment, tray pneumatics 230 comprises a 2-way valve 402 (generally, a "tray valve"). 2-way valve 402 is operable in a first way to provide a vacuum in a space 207 between a first seal 204 and a second seal 205, via a barrier supply tube 404 (or, e.g., a fitting), thereby generating a lower pressure in the space 207 than in the enclosure 202. 2-way valve 402 is operable in a second way to provide the lighter-than-air gas to the corresponding enclosure, via a gas supply tube 406 (or, e.g., a fitting). The term "2-way" is used in a general sense, in this case to indicate the two functions that the 2-way valve serves in the described embodiments. However, the design and functionality of the valve for tray pneumatics 230 may vary from implementation to implementation, in view of a goal of simplicity (and cost "minimization") rather than complexity.

According to an embodiment, tray pneumatics 230 comprises a quick-disconnect mechanism 408 mechanically coupled to a pneumatic supply line 410 from the rack pneumatics 240. The portion of the pneumatic system that connects the rack pneumatics 240 to each tray pneumatics 230 may comprise a main supply line from the rack pneumatics 240, and an individual feed line 411 for each tray 200, 300. The quick-disconnect mechanism 408 may be configured to disconnect from the supply line 410, or from a corresponding feed line 411 if applicable, upon the action of sliding out or removing a tray 200, 300 from the rack 352 (FIG. 3) of data storage system 350 (FIG. 3).

With reference to FIG. 4, according to an embodiment, rack pneumatics 240 comprises a vacuum source 412, operable to provide a vacuum to the 2-way valve 402 of each tray pneumatics 230, and a lighter-than-air gas source 414 (depicted as a helium (He) source, for purposes of example) operable to provide a source of the lighter-than-air gas and pressure to the 2-way valve 402 of each tray pneumatics 230, to replace relatively small amounts of gas that may escape or leak from the enclosures (keeping in mind that in practice, in the context of digital data storage, a hermetically-sealed container may have a minute but acceptable leakage rate). Rack pneumatics 240 may further comprise a pressure regulator 416 associated with the lighter-than-air gas source 414, and a pneumatic system controller 418 operating between the vacuum source 412/lighter-than-air gas source 414 and the supply line 410.

According to an embodiment, the pneumatic system controller 418 is operable, and/or programmable, to intermittently charge the supply line 410 with the lighter-than-air gas, thereby charging the supply line 410 for a relatively insignificant duration during the life cycle of the system. For a non-limiting example, the pneumatic system controller 418 may be set to charge the supply line 410 with the lighter-than-air gas for one minute each month to compensate for any leakage from all the trays 200, 300 in the rack 352 (FIG. 3B). By managing or limiting the amount of time that the system supply line 410 is charged with the lighter-than-air gas, the leakage potential of the supply line 410 (and thus the leakage requirements of the supply line 410) may be reduced or minimized. Therefore, only a limited number of components of the overall pneumatic control system for a data storage system (e.g., data storage system 350 of FIG. 3B) may be held to stringent leakage requirements, such as the lighter-than-air gas source 414 and pressure regulator 416 of rack pneumatics 240 and the 2-way valve 402 and gas supply tube 406 of tray pneumatics 230. The supply line 410 may be manufactured from relatively inexpensive materials, such as plastic tubing and fittings, for a non-limiting example, due to less challenging leakage requirements.

In addition to comprising the vacuum source 412 and lighter-than-air gas source 414, rack pneumatics 240 may further comprise an accumulator configured for storing lighter-than-air gas that is purged from an enclosure 202, 302 (FIGS. 2, 3A) prior to maintenance and/or field servicing of the corresponding tray 200, 300 (FIGS. 2, 3A). For example, the lighter-than-air gas contained within the enclosure 202 may be salvaged to the accumulator for later reuse, prior to removal of the cover 216, 316 (FIGS. 2, 3A) of the enclosure 202.

Method for Controlling an Internal Environment of a Data Storage System

Figure 6:
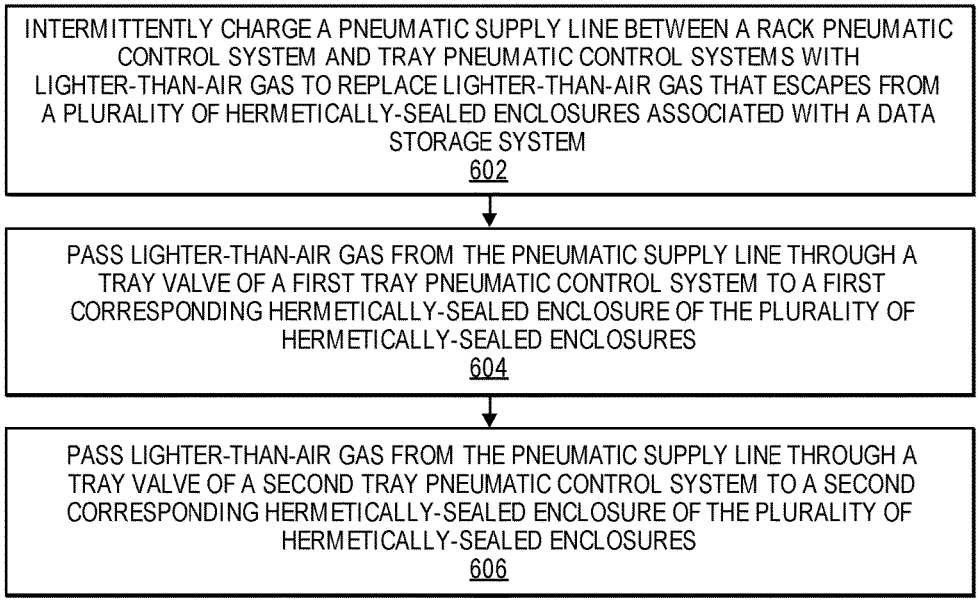
FIG. 6 is a flow diagram illustrating a method for controlling an internal environment within a data storage system comprising a plurality of hermetically-sealed enclosures, according to an embodiment.

FIG. 6 is a flow diagram illustrating a method for controlling an internal environment within a data storage system comprising a plurality of hermetically-sealed enclosures, according to an embodiment, where each hermetically-sealed enclosure comprises a cover and contains a lighter-than-air gas and is pneumatically coupled with a corresponding tray pneumatic control system pneumatically coupled to a rack pneumatic control system. Example uses include controlling the environment within the hermetically-sealed data storage system 200 ("tray 200") of FIG. 2, and the hermetically-sealed data storage system 300 ("tray 300") of FIGS. 3A, 3B.

At block 602, a pneumatic supply line between the rack pneumatic control system and the tray pneumatic control systems is intermittently charged (e.g., filled) with the lighter-than-air gas, to replace lighter-than-air gas that escapes from the hermetically-sealed enclosures. For example, pneumatic system controller 418 (FIG. 4) may operate and/or open the lighter-than-air gas source 414 (FIG. 4), and operate the pressure regulator 416 if necessary, to charge the supply line 410 (FIG. 4).

At block 604, according to an embodiment, some lighter-than-air gas is passed from the pneumatic supply line through a tray valve of a first tray pneumatic control system to a corresponding first hermetically-sealed enclosure of the plurality of hermetically-sealed enclosures. For example, lighter-than-air gas from supply line 410 is passed through a 2-way valve 402 (FIGS. 4, 5) of a first tray pneumatics 230 corresponding to a first hermetically-sealed enclosure 202 (FIGS. 2, 4).

At block 606, according to an embodiment, some lighter-than-air gas is passed from the pneumatic supply line through a tray valve of a second tray pneumatic control system to a corresponding second hermetically-sealed enclosure of the plurality of hermetically-sealed enclosures. For example, lighter-than-air gas from supply line 410 is passed through a second 2-way valve 402 (FIGS. 4, 5) of a different second tray pneumatics 230 corresponding to a different second hermetically-sealed enclosure 202 (FIGS. 2, 4).

Method for Servicing a Hermetically-Sealed Data Storage System

Figure 7:
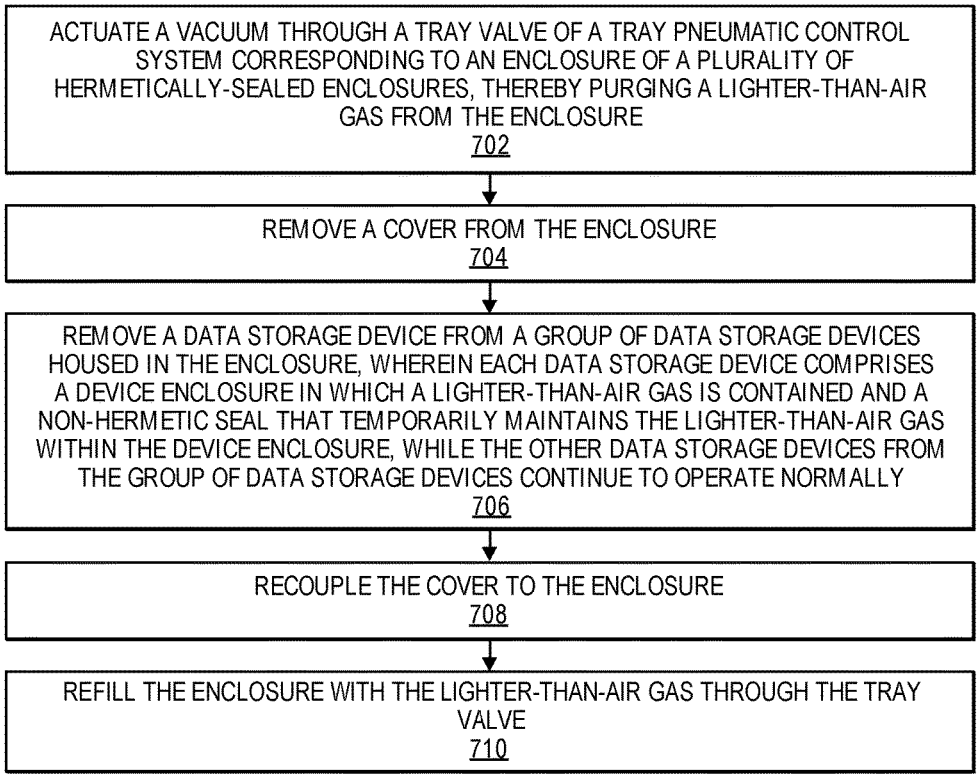
FIG. 7 is a flow diagram illustrating a method for servicing a data storage system comprising a plurality of hermetically-sealed enclosures, according to an embodiment.

FIG. 7 is a flow diagram illustrating a method for servicing a data storage system comprising a plurality of hermetically-sealed enclosures, according to an embodiment, where each hermetically-sealed enclosure comprises a cover and contains a lighter-than-air gas and is pneumatically coupled with a corresponding tray pneumatic control system pneumatically coupled to a rack pneumatic control system. Example uses include servicing the hermetically-sealed data storage system 200 ("tray 200") of FIG. 2, and the hermetically-sealed data storage system 300 ("tray 300") of FIGS. 3A, 3B.

At block 702, a vacuum is actuated through a tray valve of a tray pneumatics control system corresponding to an enclosure of the plurality of hermetically-sealed enclosures, thereby purging a lighter-than-air gas from the enclosure. For example, pneumatic system controller 418 (FIG. 4) may actuate vacuum source 412 (FIG. 4) to apply a vacuum through 2-way valve 402 (FIG. 4) of tray pneumatics 230 (FIGS. 2, 4, 5) to purge helium or another lighter-than-air gas contained within an enclosure 202 (FIGS. 2, 4) of tray 200 (FIG. 2), 300 (FIGS. 3A, 3B). According to an embodiment, the lighter-than-air gas that is purged from the enclosure 202, 302 is stored in an accumulator.

At block 704, the cover is removed from the enclosure. For example, cover 216 (FIG. 2), 316 (FIG. 3) is removed from the enclosure 202, e.g., in order to service (e.g., repair or replace) a failed data storage device 220 (FIG. 2) housed in the enclosure 202. According to an embodiment, the cover 216, 316 that is removed from the enclosure may be kept removed from the enclosure 202, 302 for at least a week while the other data storage devices 220, 320 from the group of devices continue to operate normally, as described as a "soft-seal" in more detail elsewhere herein.

At block 706, a data storage device is removed from a group of data storage devices housed in the enclosure, where each data storage device comprises a device enclosure in which a lighter-than-air gas is contained and a non-hermetic seal that temporarily maintains the lighter-than-air gas within the device enclosure, while the other data storage devices from the group continue to operate normally. For example, a data storage device 220, 320 (FIGS. 2, 3A) is removed from a group of data storage devices housed in the enclosure 202, 302 (FIGS. 2, 3A), where each data storage device 220, 320 comprises a device enclosure 221, 321 (FIGS. 2, 3A) in which a lighter-than-air gas is contained and a non-hermetic seal 222, 322 (FIGS. 2, 3A) that temporarily maintains the lighter-than-air gas within the device enclosure 221, 321, while the other data storage devices 220, 320 from the group continue to operate normally.

According to an embodiment, at block 708, the cover is recoupled to the enclosure, for example, the cover 216, 316 is recoupled to the enclosure 202, 302. Further, and according to an embodiment, at block 710 the enclosure 202, 302 is refilled with the lighter-than-air gas. According to embodiments, the enclosure 202, 302 may be refilled from a canister of lighter-than-air gas (e.g., source 414 of FIG. 4), and/or refilled from an accumulator if applicable.

EXTENSIONS AND ALTERNATIVES

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alpha-numeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A data storage system comprising:
   a plurality of hermetically-sealed enclosures containing a lighter-than-air gas;
   a plurality of data storage devices housed in each said hermetically-sealed enclosure, wherein each said data storage device comprises a device enclosure in which the lighter-than-air gas is contained;
   a plurality of tray pneumatic control systems each pneumatically coupled to a corresponding hermetically-sealed enclosure of said plurality of hermetically-sealed enclosures;
   a rack pneumatic control system pneumatically coupled to each tray pneumatic control system of said plurality of tray pneumatic control systems;
   a first sealing member at an interface of each said hermetically-sealed enclosure and an external environment; and
   a second sealing member spaced from each said first sealing member;
   wherein a tray pneumatic control system of said plurality of tray pneumatic control systems comprises:
   a tray valve, operable in a first way to provide a vacuum in a space between said first sealing member and said second sealing member, thereby generating a lower pressure in said space than in said corresponding hermetically-sealed enclosure, and operable in a second way to provide said lighter-than-air gas to said corresponding hermetically-sealed enclosure.

2. The data storage system of claim 1, wherein said tray pneumatic control system further comprises a quick-disconnect mechanism mechanically coupled to a pneumatic supply line from said rack pneumatic control system.

3. The data storage system of claim 1,
   wherein said tray pneumatic control system further comprises:

a quick-disconnect mechanism mechanically coupled to a pneumatic supply line from said rack pneumatic control system; and wherein said rack pneumatic control system comprises:
   a vacuum source operable to provide a vacuum to said tray valve of said tray pneumatic control system, and
   a lighter-than-air gas source operable to provide a source of said lighter-than-air gas to said tray valve of said tray pneumatic control system.

4. The data storage system of claim 3, further comprising a pneumatic system controller operable to intermittently charge said pneumatic supply line with said lighter-than-air gas.

5. The data storage system of claim 1, wherein said lighter-than-air gas comprises helium.

6. The data storage system of claim 1, wherein one or more of said data storage devices comprises a non-hermetic seal that temporarily maintains said lighter-than-air gas within said device enclosure.

7. The data storage system of claim 6, wherein:
one or more of said hermetically-sealed enclosures comprises a cover; and
said non-hermetic seal temporarily maintains said lighter-than-air gas within a corresponding said device enclosure while said cover of said hermetically-sealed enclosure is removed, such that said data storage device remains operable while said cover is removed.

8. A method for servicing a data storage system according to claim 1, wherein each of said plurality of hermetically-sealed enclosures comprises a cover, the method comprising:
   actuating a vacuum through a tray valve of said tray pneumatic control system corresponding to an enclosure of said plurality of hermetically-sealed enclosures, thereby purging said lighter-than-air gas from said enclosure;
   removing said cover from said enclosure; and
   removing a data storage device from a group of data storage devices housed in said enclosure, wherein each said data storage device comprises a device enclosure in which a lighter-than-air gas is contained and a non-hermetic seal that temporarily maintains said lighter-than-air gas within said device enclosure, while the other data storage devices from said group of data storage devices continue to operate normally.

9. The method of claim 8, further comprising:
recoupling said cover to said enclosure; and
refilling said enclosure with said lighter-than-air gas through said tray valve.

10. The method of claim 9, further comprising:
intermittently charging a pneumatic supply line between said rack pneumatic control system and said tray pneumatic control systems with said lighter- than-air gas; and
passing said lighter-than-air gas from said pneumatic supply line through said tray valve to said enclosure, thereby replacing lighter-than-air gas that passed from said enclosure.

11. The method of claim 9, further comprising:
providing a vacuum to said tray valve of said tray pneumatic control system; and
operating said tray valve in said first way to provide a vacuum in said space between said first sealing member and said second sealing member.

12. The method of claim 9, further comprising:
providing said lighter-than-air gas to said tray valve of said tray pneumatic control system; and
operating said tray valve in said second way to provide said lighter-than-air gas to said enclosure.

13. The method of claim 9, wherein said lighter-than-air gas comprises helium or nitrogen.

14. A data storage system comprising:
a plurality of hermetically-sealed enclosures containing a lighter-than-air gas;
a plurality of data storage devices housed in each said hermetically-sealed enclosure, wherein each said data storage device comprises a device enclosure in which the lighter-than-air gas is contained;
tray means for pneumatically controlling a corresponding hermetically-sealed enclosure of said plurality of hermetically-sealed enclosures;
rack means for pneumatically controlling each tray means;
first sealing means at an interface of each said hermetically-sealed enclosure and an external environment; and
second sealing means spaced from each said first sealing means;
wherein said tray means comprises:
   means for providing a vacuum in a space between said first sealing means and said second sealing means, thereby generating a lower pressure in said space than in said corresponding hermetically-sealed enclosure, and
   means for providing said lighter-than-air gas to said corresponding hermetically-sealed enclosure.

15. The data storage system of claim 14, wherein said tray means further comprises quick-disconnect means mechanically coupled to a pneumatic supply line from said rack means.

16. The data storage system of claim 15, further comprising:
pneumatic system controller means for intermittently charging said pneumatic supply line with said lighter-than-air gas.

17. The data storage system of claim 14, wherein said rack means comprises vacuum means for providing a vacuum to said tray means.

18. The data storage system of claim 17, wherein said rack means further comprises gas source means for providing said lighter-than-air gas to said tray means.

19. The data storage system of claim 14, wherein said lighter-than-air gas comprises helium.

20. The data storage system of claim 14, wherein said lighter-than-air gas comprises nitrogen.

* * * * *